United States Patent [19]

Lipschutz

[11] Patent Number: 4,498,530

[45] Date of Patent: Feb. 12, 1985

[54] FLEXIBLE THERMAL CONDUCTION ELEMENT FOR COOLING SEMICONDUCTOR DEVICES

[75] Inventor: Lewis D. Lipschutz, Poughkeepsie, N.Y.

[73] Assignee: International Business Machines Corporation, Armonk, N.Y.

[21] Appl. No.: 289,025

[22] Filed: Aug. 3, 1981

[51] Int. Cl.³ ............................................. F28F 7/00
[52] U.S. Cl. ................................. 165/185; 165/80 B; 165/80 C; 357/82; 361/386
[58] Field of Search ................. 165/185, 80 C, 80 B; 174/16 HS; 357/81, 82; 361/386, 385

[56] References Cited

U.S. PATENT DOCUMENTS

| | | | |
|---|---|---|---|
| 4,226,281 | 10/1980 | Chu | 165/185 |
| 4,235,283 | 11/1980 | Gupta | 165/185 |
| 4,263,965 | 4/1981 | Mansuria et al. | 165/185 |

OTHER PUBLICATIONS

Dombroski, et al. IBM TDB, vol. 19, No. 12, May 1977, p. 4683.

Primary Examiner—Albert W. Davis, Jr.
Attorney, Agent, or Firm—Wolmar J. Stoffel

[57] ABSTRACT

A flexible, extensible thermal conduction element for use in a semiconductor package to conduct heat from a device to a cold plate, or cover, featuring a plurality of thin flexible interleaved leaf elements capable of bridging the gap between the device and cold plate, or cover, and accommodating for gap variability and non-parallel surfaces.

10 Claims, 10 Drawing Figures

FLEXIBLE THERMAL CONDUCTION ELEMENT FOR COOLING SEMICONDUCTOR DEVICES

DESCRIPTION

1. Technical Field

This invention relates to techniques and structure for the dissipation of thermal energy generated by semiconductor devices. More particularly, the present invention relates to conduction elements for cooling semiconductor devices in single device or multi-device integrated circuit package assemblies where the devices are mounted on substrates with solder bonds, and the caps are mounted in close proximity to the back sides of the devices.

The high circuit densities in modern integrated circuit semiconductor devices require that the heat generated by their operation be efficiently removed in order to maintain the temperature of the devices within limits that will keep the operating parameters of the devices within pre-determined ranges, and also prevent destruction of the device by overheating. The problems of heat removal are increased when the device is connected to the supporting substrate with solder terminals that electrically connect the device to appropriate terminals on the substrate. On such solder bonded devices, the heat transfer that can be accomplished through the solder bonds is limited, as compared to back bonded devices. Cooling of the semiconductor devices can be achieved by immersing the devices in a suitable liquid coolant. However, these cooling techniques can result in corrosion of the device and substrate metallurgy and also present problems if the package must be reworked. Cooling can also be achieved by providing a conductive link of material, such as conductive pistons or spring elements, between the device and the cap or cold plate. These elements must be capable of forming a good interface contact over as large an area as possible in order to maintain a low thermal resistance. With cooling pistons, forming such interfaces is difficult because the devices may be tilted, resulting in an unsatisfactory point or line contact. In general, cooling pistons must be used in an atmosphere of inert gasses with higher heat conductivity than air, or a grease or other conformal means be provided at the piston end—device interface. Another disadvantage is that the pistons may subject the devices being cooled to shock when the package is subjected to inertial forces. Spring elements for thermal conduction between a device and cold plate are known. A prevalent problem is designing sufficiently heavy springs that will efficiently conduct heat and yet not impose forces on the devices that will crack or chip them. The consideration becomes more severe as the tolerance of the gap between the device and cap are increased.

2. Background Art

The following prior art references relate to various structures for removing heat from solder bonded semiconductor devices. U.S. Pat. No. 3,993,123 discloses a semiconductor package in which a movable heat conductive piston is placed in contact with the back side of a solder bonded semiconductor device to conduct heat away from the device to a cooling plate. U.S. Pat. Nos. 4,034,468 and 4,081,825 both disclose semiconductor packages wherein a low melting point solder is provided in contact with the back side of a solder bonded device and with the module cap to remove heat from the device. U.S. Pat. No. 4,156,458 discloses a cooling arrangement including a flexible heat conductive metallic foil bundle extending between the back side of a device and the heat sink. IBM Technical Disclosure Bulletin Vol. 21 No. 3 Aug. 1978 P. 1141 discloses a thermal shunt element disposed between a solder bonded semiconductor device and a module cap comprised of a rectangular center portion and a pair of divergent wings that contact the cap. IBM TDB Vol. 20 No. 6 Nov. 1977 P. 2214 and U.S. Pat. No. 4,146,458, issued May 29, 1979 disclose a plurality of preform sheets of aluminum foil nested together and disposed between solder bonded semiconductor devices and a housing to remove heat from the devices. IBM TDB Vol. 19 No. 12 May 1977 P. 4683 discloses a thermal conduction bridge element between a solder bonded semiconductor device and a cap which features a plurality of interleaved relatively slidable fins. Application Ser. No. 249,262, filed Mar. 30, 1981, now U.S. Pat. No. 4,442,450 assigned to the same assignee as this application, discloses a thermal bridge for conducting heat from a device to the cover which includes a relatively thick metal sheet provided with cuts that define at least one tab element.

DISCLOSURE OF INVENTION

The invention is an improved cooling element adapted to be positioned between a solder bonded semiconductor device and a module cap or cold plate to form a heat conduction bridge between the device and cap or cold plate. The cooling element has a plurality of interleaved thin plates arranged so that the ends of the element are expandable and also capable of adjusting to intimately contact the device, even though the top surface of the device is tilted relative to the cap or cold plate surface. The thermal element has a first set of flexible leaf elements, a set of spacer elements between the leaf elements, a second set of flexible leaf elements with portions thereof disposed in slidable relation to the first set of leaf elements, a second set of space elements disposed between the individual leaf elements, a means to hold the first and second leaf elements in assembled and extendable relation, and a spring to bias the leaf elements in extended relation. The thermal bridge element of the invention is sufficiently flexible to allow the ends of the element to intimately contact the back side of the device and the cover or cap, and thereby achieve a low overall thermal resistance that permits heat to be transferred from the device to the cap or cold plate.

BRIEF DESCRIPTION OF THE DRAWINGS

The details of my invention will be described in connection with the accompanying drawing in which.

BEST MODE FOR CARRYING OUT THE INVENTION

Figure 1:
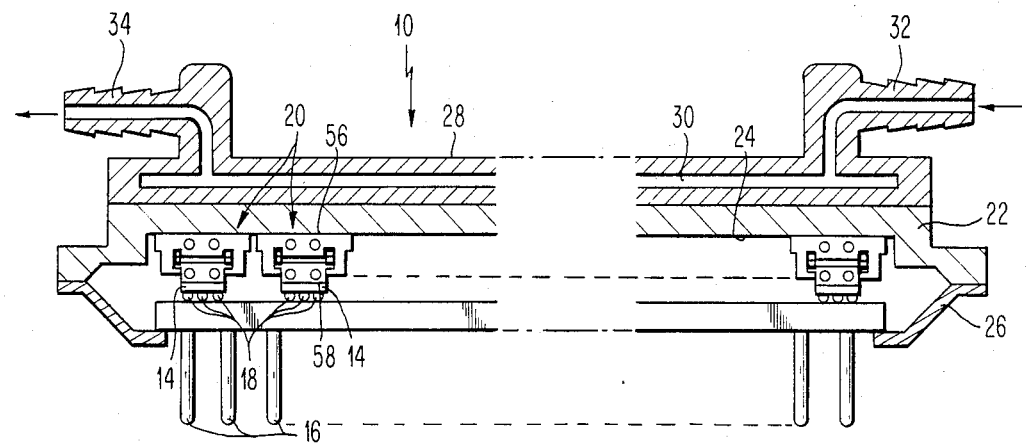
FIG. 1 is an elevational view in broken section illustrating a semiconductor package including semiconductor devices solder bonded to a substrate and a cooling plate with the thermal bridge elements disposed in operative cooling relation to the devices and cold plate.

Referring to the drawings, FIG. 1 illustrates a semiconductor package 10 and the association of the thermal conduction element 20 of my invention. Package 10 has a dielectric substrate 12 containing a metallurgy pattern, either within or on the top surface that interconnects semiconductor devices 14 with each other and to pins 16 protruding from the bottom surface of substrate 12.

The devices 14 are joined to the metallurgy pattern in or on substrate 12 by solder bonds 18. A cover element 22 is positioned over devices 14 with a surface 24 in spaced relation to the top surfaces of devices 14. A flange member 26, secured or brazed to substrate 12, is joined to cap 22. A cold plate 28 with passages 30 and inlet 32 and outlet 34 is mounted over cap 22 for the purpose of removing heat from the cap and from the devices 14. In use, a cooling fluid is introduced into inlet 32 and removed through outlet 34. In contrast, the cap 22 can be provided with fins or the like, as an alternative to the cooling plate 28. The thermal element 20 of my invention provides a thermal path from device 14 to the cap having an overall low thermal resistance that, in use, will provide dependable, consistent cooling of the devices during operation.

Figure 2:
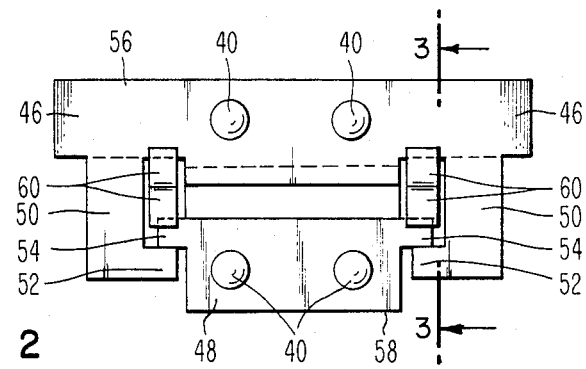
FIG. 2 is an elevational view in enlarged scale illustrating the structure of a thermal bridge of the invention.
Figure 3:
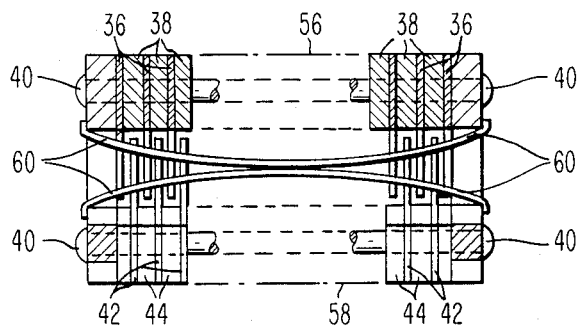
FIG. 3 is a sectional view taken on line 33 of FIG. 2, illustrating the interleaved structure of the thermal bridge of the invention.
Figure 4:
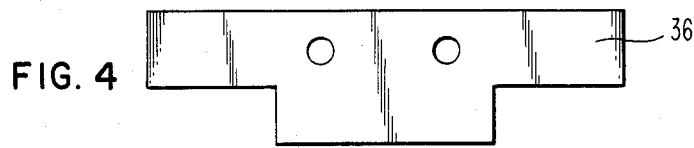
FIG. 4 is a view of a single leaf element used in the thermal bridge element of the invention.
Figure 5:
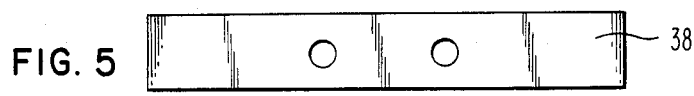
FIG. 5 is a view of a single spacer element.

Referring now to FIGS. 2 and 3, there is depicted a thermal bridge element of the invention. Element 20 has a first set of flat, thin, flexible leaf elements 36 with spacer elements 38 disposed between the elements. The leaf elements and spacers are maintained in rigid relation by a pair of bolts or rivets 40. As indicated in FIG. 3 a portion of each of the leaf elements 36 extend well beyond the spacer elements 38. A second set of flat, thin, flexible leaf elements 42, separated by spacer elements 44, also with portions extending beyond the spacer elements, are interleaved with the leaf elements 36. Leaf elements 42 and spacer elements 44 are maintained in rigid relation by a pair of rivets or bolts 40. FIGS. 4 and 5 illustrate the shape of leaf elements 36 and spacer elements 38. Preferably leaf and spacer elements 42 and 44 have the same configuration as the leaf and spacer elements 36 and 38.

In order to prevent the first and second sets of leaf elements from separating, there is provided on each end of the set of leaves a pair of end plates 46 and 48 as shown in FIG. 2. The end plates are secured to the sets of leaf elements by rivets 40. End plate 46 has two downwardly spaced extensions 50 terminating in an inwardly extending projection 52. End plate 48 has outwardly extending projections 54 that interact with projections 52 and prevent the first and second sets of leaf elements from separating. As indicated in FIG. 3, the leaf element sets are free to slide longitudinally relative to each other permitting the opposed flat surfaces 56 and 58 to be positioned in varying distances from each other. Also, the flexible nature of the leaf elements 36 and 42 permit limited tilting action of surfaces 56 and 58. In order to bias the separate parts of the bridge element, a spring 60 is provided which engages the opposing end plates 46 and 48, and biases the sets of leaf elements in outward extending relation. In operation, thermal bridge element 20 in the position shown in FIG. 1 with the surface 56 in contact with underside surface 24 of cap 22, and the surface 58 in contact with the device conducts heat from the device to the cold plate 28. Bridge element 20 is adapted to accommodate for variations in spacing between the top surface of device 14 and surface 24 of cap 22. It is also capable of accommodating for tilting of chip 14 due to variations in solder bonds 18. The thermal efficiency of the system can be further enhanced by soldering surface 56 and 58 to the back side of the cap and the device or providing the suitable grease or other type of material at the interfaces.

The size and shape of the thermal bridge element 20 will depend on the spacing of devices 14 and the sizes of the devices. The spacing of devices 14 is generally the determining factor in setting the size of the bridge elements. If, the spacing of devices 14 is very close, the surface area of surface 56 must be accommodated to the surface area available. The material used in leaf elements 36 and 42 should preferably be capable of effectively conducting heat i.e., have a high thermal conductivity. In addition, the leaf elements should be sufficiently flexible to accommodate for tilting of the bottom surface 58 relative to top surface 56. In general, the thickness of leaf element 36 can be of any suitable thickness, preferably for semiconductor chip cooling applications from 0.2 to 5.0 mils, more preferably from 0.7 mils to 1.0 mil. The material of the leaf elements is preferably copper, silver, aluminum or alloys thereof which do not materially affect the thermal conductivity but impart more spring resilience to the material. In general, the spacer element 38 and 44 is approximately twice the thickness of the leaf element 36. A preferred material for leaf elements 36 and 42 is a zirconiumcopper alloy consisting of 99.8% copper and 0.2% zirconium.

Figures 6, 7:
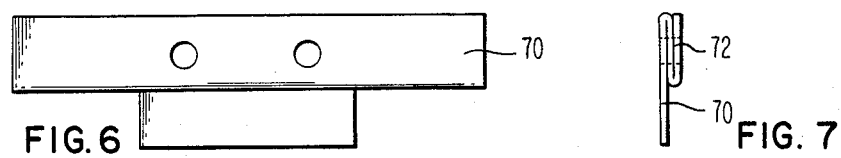
FIG. 6 is a view of a modified leaf element and spacer of another preferred specific embodiment of the invention.
FIG. 7 is an end view of the leaf element of FIG. 6.

An alternative embodiment structure of the combination of leaf elements and spacers is shown in FIGS. 6 and 7. A leaf element-spacer combination 70 can be formed by shaping a single piece of flat stock in the configuration illustrated in FIG. 7 where the spacing portion consists of two folded-over portions 72.

Figure 8:
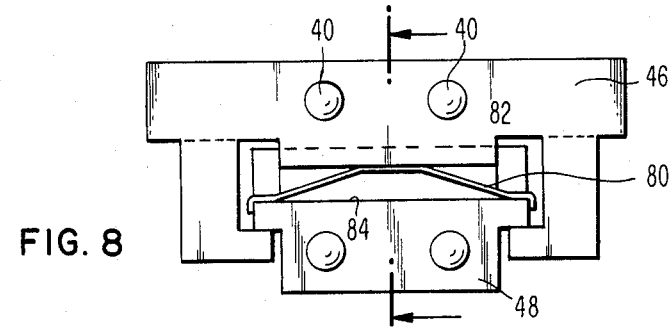
FIG. 8 is a front view illustrating an alternate spring embodiment of the thermal element of the invention.
Figure 9:
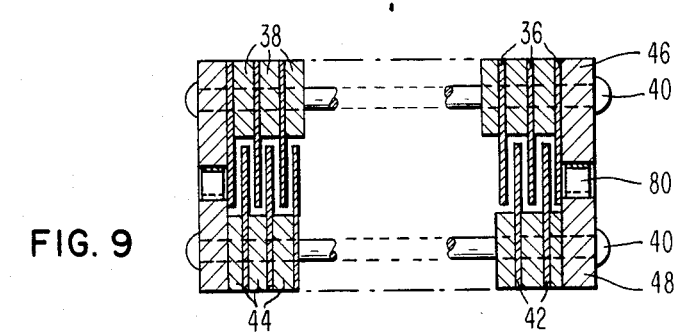
FIG. 9 is a sectional view taken on line 9—9 of FIG. 8.

An alternate spring arrangement is illustrated in FIGS. 8 and 9 of the drawings. The leaf elements and end plates are similar to that illustrated and explained in FIGS. 2 and 3. Spring 80 is disposed between surfaces 82 and 84 of end plates 46 and 48 as indicated in FIG. 8. Spring 80 biases the sets of leaf elements 36 and 42 outwardly in extended relation in a manner similar to the embodiment shown in FIG. 2 by spring 60.

Figure 10:
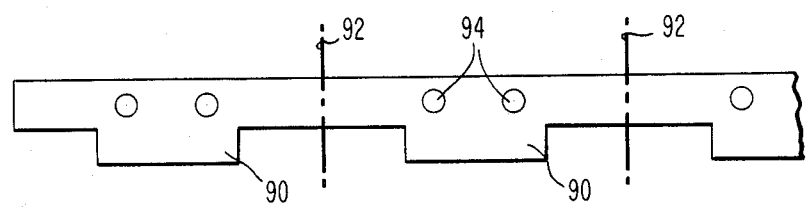
FIG. 10 is a view of a continuous metal strip illustrating a preferred method of making the thermal bridge element of the invention.

A preferred technique for fabricating the thermal bridge elements 20 of the invention consists of initially shaping elongated strips 86 of thermally conductive material having the general shape illustrated in FIG. 10. A similar strip is assembled in opposed relation with the end portions 90 in overlapping alternating relation. At the same time, the spacers are also assembled until the desired width of the element is built up. At this time, the strips 86 are severed on lines 92 and holes 94 drilled. End plates 46 and 48 are positioned on each end of the stacked assembly, rivets 40 put in place and secured. Biasing spring, either of the type illustrated in FIGS. 2 and 3 or in FIGS. 8 and 9, are then inserted in place and the assembly is ready for use. If desirable the end surfaces of the assembly i.e., 56 and 58, can be ground or polished. The spacing and leaf elements 70 can be used in the same manner described if such embodiment is desired.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

I claim:

1. A thermal bridge element for use in a semiconductor package to conduct heat from the back side of a solder bonded semiconductor device to a cold plate located in close proximity to the device, comprising,
   - a first set of flat, thin, flexible leaf elements, each leaf element having a thickness in the range of 0.2 to 5 mils,
   - a first flat spacer means spacing said first set of individual leaf elements, a portion of each of said leaf elements projecting beyond said spacer means,
   - means to hold said first leaf elements and said first spacer means in rigid laminated relation as a first unit,
   - a second set of flat, thin, flexible leaf elements with portions thereof disposed in slidable overlapping relation to said first set of leaf elements, each leaf element having a thickness in the range of 0.2 to 5 mils.
   - a second flat spacer means spacing said second set of individual leaf elements,
   - said second leaf elements having a portion that extends beyond said second spacer means,
   - a means to hold said second leaf elements and said second spacer means in rigid laminated relation as a second unit,
   - a spring means to bias said first and said second units in outwardly extending relation.

2. The thermal bridge element of claim 1 wherein said first and said second sets of leaf elements are made of a heat conductive metal or alloy where the primary metal is selected from the group consisting of Cu, Al and Ag.

3. The thermal bridge element of claim 2 wherein the thickness of said individual leaf elements is in the range of 0.7 to 1 mil.

4. The thermal bridge element of claim 2 wherein said first and said second spacer means are comprised of a plurality of flat elements positioned between said first and said second sets of leaf elements.

5. The thermal bridge element of claim 4 wherein the thickness of each element of said plurality of flat elements is approximately twice the thickness of a single leaf element.

6. The thermal bridge element of claim 2 wherein said first and said second spacer means are comprised of a twice folded over portion of each of the leaf elements.

7. The thermal bridge element of claim 1 which further includes
   - a first abutment surface associated with said first unit,
   - a second abutment surface associated with said second unit that engages said first abutment surface on said first unit to establish a limit to outward movement of said first and said second sets of leaf elements,
   - said spring means operative to cause engagement between said first and said second abutment surfaces.

8. The thermal bridge element of claim 1 which further include a pair of end plates provided with interlocking portions, said interlocking portions comprising said first and said second abutment surfaces that limit the extendability of said first and said second units.

9. The thermal bridge element of claim 8 wherein said spring means is a pair of leaf springs positioned parallel to said leaf elements and with each spring in engagement with portions of said end plates.

10. The thermal bridge element of claim 8 wherein said spring means is a pair of leaf springs positioned perpendicular to said leaf elements, and with each spring in abutting engagement with portions of each set of end plates.

* * * * *